United States Patent
Jadhav et al.

(10) Patent No.: US 7,952,207 B2
(45) Date of Patent: May 31, 2011

(54) FLIP-CHIP ASSEMBLY WITH ORGANIC CHIP CARRIER HAVING MUSHROOM-PLATED SOLDER RESIST OPENING

(75) Inventors: Virendra R. Jadhav, Wappingers Falls, NY (US); Jayshree Shah, Poughkeepsie, NY (US); Kamalesh K. Srivastava, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 341 days.

(21) Appl. No.: 11/950,431

(22) Filed: Dec. 5, 2007

(65) Prior Publication Data

US 2009/0146316 A1  Jun. 11, 2009

(51) Int. Cl.
*H01L 23/52* (2006.01)
(52) U.S. Cl. ........ 257/778; 257/737; 257/738; 257/781; 257/E23.021
(58) Field of Classification Search .................. 257/737, 257/738, 777–781, E23.021, E23.023
See application file for complete search history.

(56) References Cited

U.S. PATENT DOCUMENTS

| | | | |
|---|---|---|---|
| 6,018,196 A | 1/2000 | Noddin | |
| 6,492,600 B1 | 12/2002 | Jimarez et al. | |
| 6,596,618 B1 | 7/2003 | Narayanan et al. | |
| 6,631,838 B2 | 10/2003 | Kim et al. | |
| 6,759,318 B1 | 7/2004 | Chang | |
| 6,805,974 B2 | 10/2004 | Choi et al. | |
| 6,884,944 B1 | 4/2005 | Kuwako | |
| 7,049,526 B2 | 5/2006 | Jones | |
| 7,122,897 B2 * | 10/2006 | Aiba et al. | 257/738 |
| 7,170,172 B2 * | 1/2007 | Tomimori et al. | 257/739 |
| 2006/0160346 A1 | 7/2006 | Hori | |
| 2006/0204650 A1 * | 9/2006 | Hu | 427/96.1 |
| 2006/0279000 A1 * | 12/2006 | Chang et al. | 257/779 |
| 2007/0090160 A1 | 4/2007 | Masumoto | |

* cited by examiner

*Primary Examiner* — Matthew E Warren
(74) *Attorney, Agent, or Firm* — Gibb I.P. Law Firm, LLC; Yuanmin Cai, Esq.

(57) ABSTRACT

Disclosed are embodiments of a flip-chip assembly and method using lead-free solder. This assembly incorporates mushroom-plated metal layers that fill and overflow solder resist openings on an organic laminate substrate. The lower portion of metal layer provides structural support to its corresponding solder resist opening. The upper portion (i.e., cap) of each metal layer provides a landing spot for a solder joint between an integrated circuit device and the substrate and, thereby, allows for enhanced solder volume control. The additional structural support, in combination with the enhanced solder volume control, minimizes strain on the resulting solder joints. Additionally, the cap further allows the minimum diameter of the solder joint on the substrate-side of the assembly to be larger than the diameter of the solder resist opening. Thus, the invention decouples C4 reliability concerns from laminate design concerns and, thereby, allows for greater design flexibility.

15 Claims, 7 Drawing Sheets

FLIP-CHIP ASSEMBLY WITH ORGANIC CHIP CARRIER HAVING MUSHROOM-PLATED SOLDER RESIST OPENING

BACKGROUND

1. Field of the Invention

The embodiments of the invention generally relate to flip-chip assemblies and, more particularly, to a lead-free flip-chip assembly with an organic chip carrier that incorporates mushroom-plated solder resist openings.

2. Description of the Related Art

A flip-chip assembly (i.e., a flip-chip package) is an integrated circuit device (e.g., a semiconductor chip, a die, etc.) mounted on an organic laminate substrate (e.g., a chip carrier) by C4 (i.e., controlled collapsed chip connection) attachment. Typically, such assemblies are formed by forming solder bumps on an array of conductive pads on the active surface of the integrated circuit device. The device is then "flipped" and positioned such that the device solder bumps are located adjacent to corresponding solder pads within solder resist openings on an organic laminate substrate. Solder paste within the solder resist openings on the substrate temporarily secures the solder bumps in place. Then, a reflow process is performed to create solder joints that both electrically and mechanically connect the integrated circuit device to the substrate. Conventionally, eutectic leaded solder (Pb-63% Sn) has been used to form the solder joints in flip-chip assemblies. Recently, however, government regulations around the world are requiring lead (Pb)-free electronics components. Thus, there is a need in the art for a flip-chip assembly that incorporates a Pb-free solder.

SUMMARY

In view of the foregoing, disclosed herein are embodiments of an electronic package. One embodiment of the electronic package comprises a substrate electrically and mechanically connected to a chip by a solder joint. The solder joint comprises a solder pad positioned on the substrate. A solder resist layer is also positioned on the substrate such that it covers the solder pad. A via, having a first diameter, extends through the solder resist layer to the solder pad. A metal layer is positioned within and above the via. Specifically, the metal layer has a lower portion that is positioned adjacent to the solder pad such that it fills the via. Additionally, the metal layer has an upper portion that is positioned above the lower portion. This second portion has a second diameter that is greater than that of the lower portion. Thus, the second portion of the metal layer extends laterally on the top surface of the solder resist layer. A solder layer is positioned above the metal layer and is adhered to a corresponding conductive pad on the chip. In another embodiment of the electronic package at least one ball limiting metallurgy layer is positioned on the metal layer such that it is between the metal layer and solder layer.

Also disclosed are embodiments of a method of forming the electronic package, described above. One embodiment of the method comprises providing a substrate. A solder pad is formed on the substrate. A solder resist layer is formed on the substrate such that it covers the solder pad. Next, a via is formed through the solder resist layer to the solder pad such that the via has a first diameter. Then, a metal layer is formed in and above the via. Specifically, a lower portion of the metal layer is formed adjacent to the solder pad so as to fill the via. An upper portion of the metal layer is formed above the lower portion such that it extends laterally on the top surface of the solder resist layer outside the via (i.e., such that the upper portion has a second diameter that is greater than the first diameter of the lower portion and via). Once the metal layer is formed, a chip can be electrically and mechanically connected to the substrate by creating a solder joint between the metal layer and a corresponding conductive pad on the chip. In another embodiment of the method, at least one ball limiting metallurgy layer is formed on the metal layer, before the chip is electrically connected to the substrate.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments without departing from the spirit thereof, and the embodiments include all such changes and modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
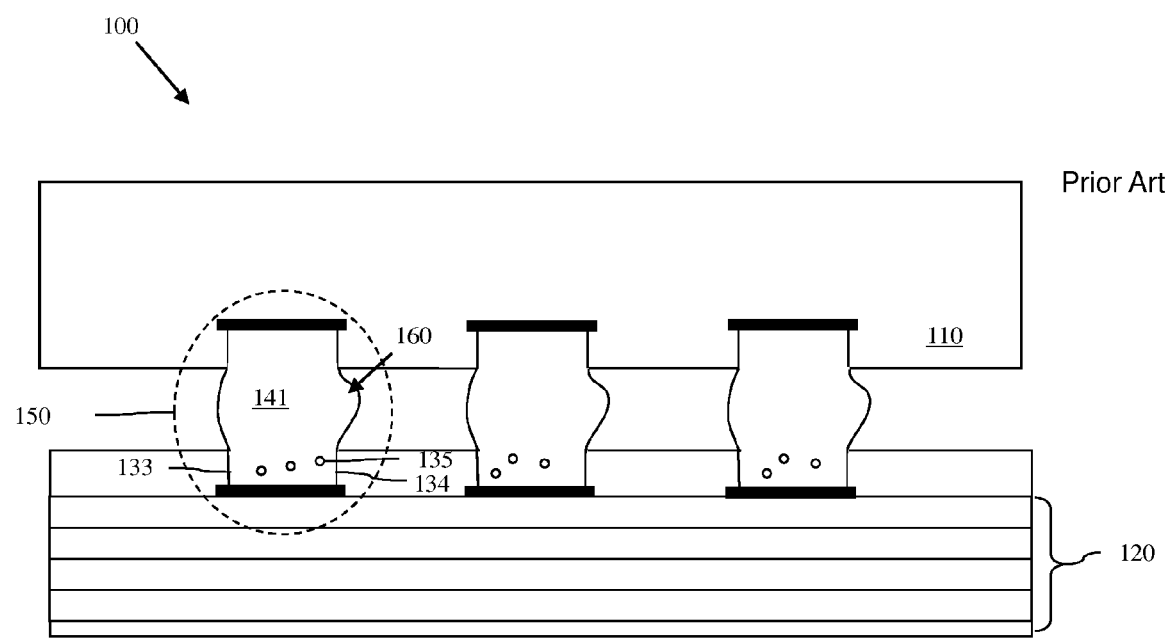
FIG. 1 is a schematic diagram illustrating a flip-chip assembly.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Figure 2:
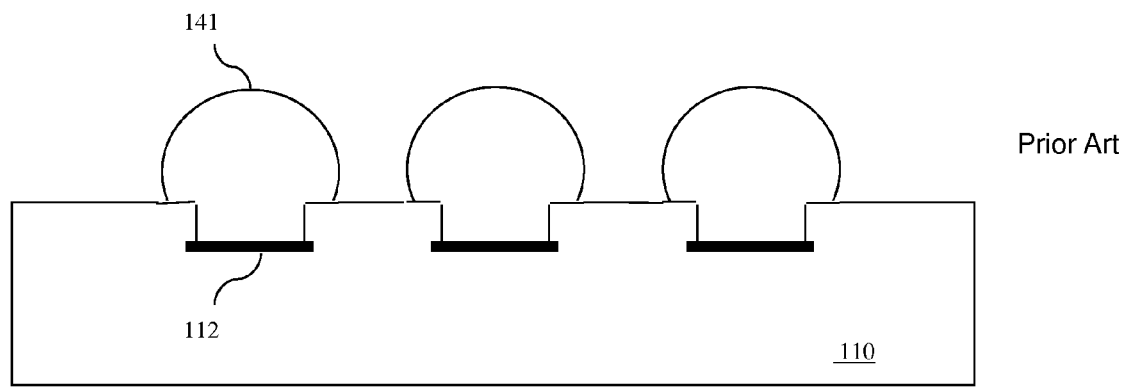
FIG. 2 is a schematic diagram illustrating a partially completed flip-chip assembly of FIG. 1

Referring to FIG. 1, a conventional flip-chip assembly 100 (i.e., a flip-chip package) comprises an integrated circuit device 110 (e.g., a semiconductor chip, a die, etc.) mounted on an organic laminate substrate 120 (e.g., a chip carrier) by C4 (i.e., controlled collapsed chip connection) attachment. Typically, such assemblies 100 are formed by forming solder bumps 141 on an array of conductive pads 112 (e.g., Cu or Al pads) on the active surface of an integrated circuit device 110 (see FIG. 2). The integrated circuit device 110 is then "flipped" and positioned such that the solder bumps 141 are located adjacent to a corresponding solder pads 122 within openings 133 of a solder resist layer 130 on the organic laminate substrate 120 (see FIG. 3). Prior to positioning the integrated circuit device 110 on the substrate 120, solder paste 134 can be placed (e.g., by injection or screening) within the solder resist openings (SROs) 133 in order to temporarily secure the solder bumps 141. Then, referring again to FIG. 1, a reflow process is performed to create solder joints 150 that both electrically and mechanically connect the integrated circuit device 110 to the substrate 120. Conventionally, eutectic leaded solder has been used to form the solder joints 150 in flip-chip assemblies. Recently, however, government regulations around the world are requiring lead (Pb)-free electronics components. Thus, there is a need in the art for a flip-chip assembly that incorporates a Pb-free solder. Unfortunately, Pb-free solders can not simply be substituted for eutectic leaded solder because of both stress and solder volume control issues.

More specifically, Pb-free solder materials generally comprise Pb-free metal alloys of tin (Sn), copper (Cu) and silver (Ag) or other suitable metals (e.g., bismuth (Bi), indium (In), zinc (Zn), antimony (Sb), etc.) in varying amounts. These Pb-free metal alloys have a higher reflow temperature and higher yield stress than leaded eutectic solder. The higher reflow temperature in combination with a mismatch in the coefficients of thermal expansion (CTE) between the integrated circuit device 110 and the organic laminate substrate 120 results in undesirable stress on the solder joints 150. That is, during reflow, the CTE mismatch between the integrated circuit device (e.g., 3 ppm/C) and the organic laminate substrate (e.g., 18-23 ppm/C) causes the solder to stretch. This introduces a certain amount of strain into the resulting solder joints 150. The higher reflow temperature of Pb-free solders amplifies the CTE mismatch effect over that seen with leaded solders, causing severe necking in the solder joint 150 (particularly, near the interface 160 with the integrated circuit device 110). The additional strain on Pb-free solders gives rise to a new set of failure modes and is even more amplified with decreases in C4 pitch and diameter. That is, device size scaling has necessitated decreases in C4 pitch and diameter to compensate for increasing device densities. As a result, the same amount of solder stretching occurs but this stretching is sustained over a smaller cross-section, thereby increasing the stress on the solder joint.

Figure 3:
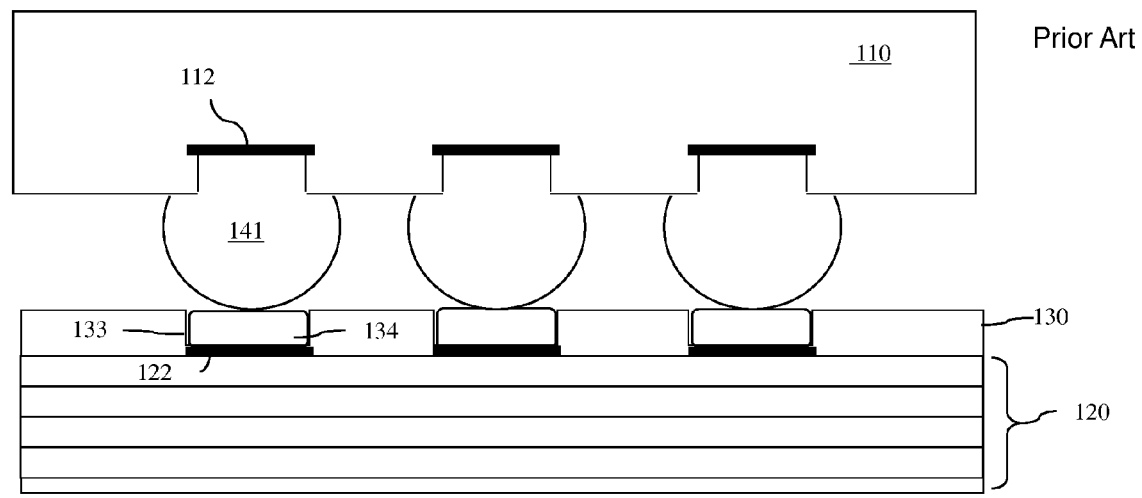
FIG. 3 is a schematic diagram illustrating a partially completed flip-chip assembly.

Additionally, as mentioned above, the SROs 133 in the organic laminate substrate 120 are often filled (e.g., by injection or screening) with solder paste 134 (as illustrated in FIG. 3) in order to facilitate the device-to-substrate join. Laminate-level solder injection and screening processes are difficult to monitor correctly and, thus, do not allow for sufficient solder volume control. Furthermore, process variations can be significant, leading to voids 135, nonwets, or other problems that effect solder joint reliability. Thus, in the prior art Pb-lead free designs there was a tradeoff between solder reliability and design flexibility. Specifically, smaller SROs were desirable for greater design flexibility (e.g., in terms of line widths/spacing). However, larger SROs were desirable to enhance solder life. Consequently, Pb-free solder can not simply be substituted for leaded solder in prior art flip-chip assemblies.

In view of the foregoing, disclosed herein are embodiments of a flip-chip assembly and method of forming the assembly using lead (Pb)-free solder. This assembly incorporates mushroom-plated metal layers that fill and overflow solder resist openings on an organic laminate substrate (e.g., on a chip carrier). The lower portion of each mushroom plated-metal layer provides structural support to its corresponding solder resist opening. The upper portion of each mushroom-plated metal layer (i.e., the cap) provides a landing spot for a solder joint between an integrated circuit device (i.e., a semiconductor chip, die, etc.) and the substrate and, thereby, allows for enhanced solder volume control. The additional structural support to the solder resist openings, in combination with the enhanced solder volume control, minimizes the strain on the resulting solder joints and, particularly, minimizes the stress along the interface between the solder joints and the integrated circuit device. Additionally, the metal layer cap further allows the minimum diameter of the solder joint on the substrate-side of the assembly to be larger than the diameter of the solder resist opening. Thus, the invention decouples C4 (i.e., controlled collapsed chip connection) reliability concerns from laminate design concerns and, thereby, allows for greater design flexibility.

Figure 4:
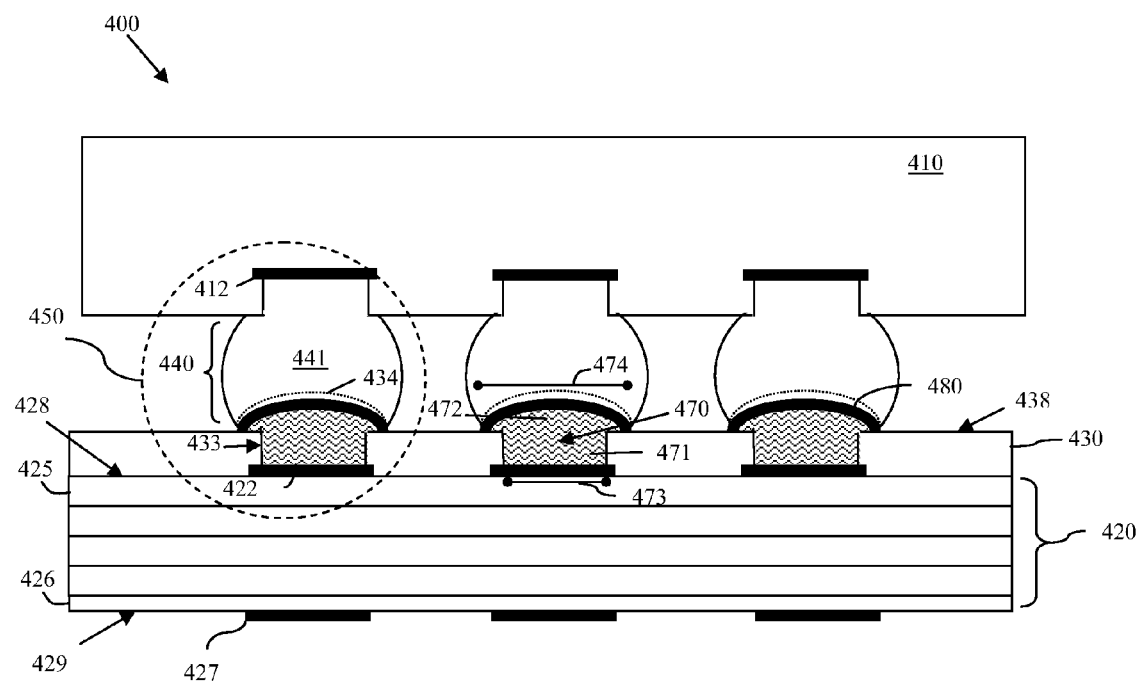
FIG. 4 is a schematic diagram illustrating an embodiment of the flip-chip assembly of the present invention.

More particularly, referring to FIG. 4, disclosed herein are embodiments of an electronic package 400 (e.g., a flip-chip package) that comprises an organic laminate substrate 420 (e.g., a chip carrier) and an integrated circuit device 410 (e.g., a semiconductor chip, a die, etc.). The device 410 and substrate 420 are electrically and mechanically connected by solder joints 450 and, specifically, by Pb-free, void-free, solder joints 450.

The organic laminate substrate 420 can comprise multiple layers of dielectric and conductive materials with the outermost layers 425-426 of the substrate 420 comprising dielectric layers. An array of one or more solder pads 422 (i.e., substrate solder pads) can be positioned on the top surface 428 of substrate 420. These substrate solder pads 422 can, for example, comprise copper (Cu) pads. Conductors 427 can be positioned on the bottom surface 429 of the substrate 420. These conductors 427 can be electrically connected to the substrate solder pads 422 (e.g., by various contacts and wire interconnects within the substrate 420) so as to allow connection of the integrated circuit device 410 in the flip-chip assembly 400 to a printed circuit board (PCB) (not shown).

A solder resist layer 430 can be positioned over the top surface 428 of the substrate 420 such that it covers the substrate solder pad(s) 422. The solder resist layer 430 can comprise any suitable solder resist material capable of preventing solder bridging, reducing solder pickup, protecting the substrate, preventing oxidation or corrosion, eliminating electromigration, etc. For example, the solder resist layer 430 can comprise a resin composition, such as, an epoxy resin, an acrylic ester resin, and/or an epoxy acrylate.

An array of one or more vias 433 (i.e., solder resist openings (SROs)) can extend vertically through the solder resist layer 430 down to corresponding substrate solder pads 422. Each via 433 (i.e., each SRO) can have a first diameter 473 (i.e., a via diameter). Additionally, each via 433 can be filled with a mushroom-shaped metal layer 470 (e.g., an electroplated copper (Cu) layer) that overflows onto the top surface 438 of the solder resist layer 430 outside the via 433. Specifically, this metal layer 470 can have a lower portion 471 that is positioned within the via 433 adjacent to a substrate solder pad 422. The lower portion 471 of the metal layer 470 can fill the entire via 433 and can, thus, have the same diameter as the via itself (i.e., the first diameter 473). The metal layer 470 can further have an upper portion 472 (i.e., a cap) that is positioned above the lower portion 471. The cap 471 can have a second diameter 474 (i.e., a cap diameter) that is greater than the via diameter 473 (i.e., that is greater than the diameter of the lower portion 471). Thus, the cap 472 extends laterally outside the via 433 onto the top surface 438 of the solder resist layer 430. The cap diameter 474 can range between approximately 1.05 and 10 times the via diameter 473. For example, the cap diameter 474 can be at least 10 microns (μm) greater than the via diameter 473. In one exemplary embodiment, the cap diameter 474 can be approximately 120 μm and the via diameter 473 can be approximately 100 μm.

Optionally, one or more ball limiting metallurgy (BLM) layers 480 can be positioned on and can coat all or a portion of the top surface of the metal layer cap 472. The BLM layer(s) 480 can comprise, for example, an adhesion layer (e.g., a chromium (Cr) layer, a titanium (Ti) layer or any other suitable adhesion layer), a barrier layer (e.g., a nickel (Ni) layer, a palladium (Pd) layer, a platinum (Pt) layer, or any other suitable layer for preventing electro-migration), and/or a bonding layer (e.g., a gold (Au) layer or any other suitable bonding layer).

A solder joint 450 can mechanically and electrically connect the integrated circuit device 410 to the substrate 420. This solder joint 450 can comprise a solder layer 440 and, more particularly, a Pb-free, essentially void-free, solder layer 440 that is positioned above the metal layer 470 and optional BLM layer(s) 480. These Pb-free solder layer can, for example, comprise a Pb-free metal alloy of tin (Sn), Cu, silver (Ag) and/or other suitable metals (e.g., bismuth (Bi), indium (In), zinc (Zn), antimony (Sb), etc.) in varying amounts.

The solder layer 440 can electrically and mechanically connect a solder pad 422 on the organic laminate substrate 420 (i.e., a substrate solder pad) to a corresponding conductive pad 412 (e.g., a Cu or Al pad) on the active surface of the integrated circuit device 410, thereby creating the solder joint 450.

Due to the mushroom-shaped metal layer 470, this solder layer 440 is essentially void-free. Specifically, as mentioned above and illustrated in FIGS. 1-3, in prior art flip-chip assemblies 100, solder paste 134 is deposited (e.g., by laminate-level injection or screening) into a solder resist opening 133 on the laminated substrate 120 and used to temporarily hold a solder bump 141 of an integrated circuit device 110 in place. During reflow, the solder paste 134 and solder bump 141 combine to form the solder layer of a solder joint 150. However, since the solder paste 134 is confined within the solder resist opening 133 on the laminate substrate 120 and volume control is difficult, voids 135 can form. Contrarily, in the present invention, the solder paste 434 is optional and, even if it is used, void formation is essentially eliminated. Specifically, in the present invention solder paste 434 is not required, if the solder bump 441 contains a sufficient amount of solder material to hold the device to the 410 to the substrate 420 (i.e., to electrically and mechanically connect the device 410 and substrate 420). In this case, other known techniques may be used to temporarily hold the device 410 in place during reflow. Without solder paste 434, void formation is minimized or eliminated all together. Furthermore, even if the optional solder paste 434 is used (e.g., if additional solder material is required to ensure adequate mechanical and electrical connection between the device 410 and substrate 420), the optional solder paste 434 is formed outside the solder resist opening 433 on metal layer cap 472 (and the optional BLM layer(s) 480). During reflow, the optional solder paste 434 and solder bump 441 combine to form the solder layer 440, thereby creating the solder joint 450. However, since the solder paste 434 is not confined within the solder resist opening 433 during reflow, the solder volume is more easily controlled and the solder paste 434 is able to flatten out, thereby minimizing or eliminating void formation. Thus, the solder layer 440 (with or without the optional solder paste 434) of solder joint 450 is formed essentially void-free. Additionally, because the metal layer 470 facilitates a larger area for the joint on laminate side, stress on the solder layer 440 is redistributed and significantly lowered over prior art structures.

Additionally, since the copper landing pad on the laminate provides a solderable surface, it is not necessary to pre-tin this surface (with solder) if the volume of solder coming from the chip side is sufficient to form a reliable joint.

Figure 5:
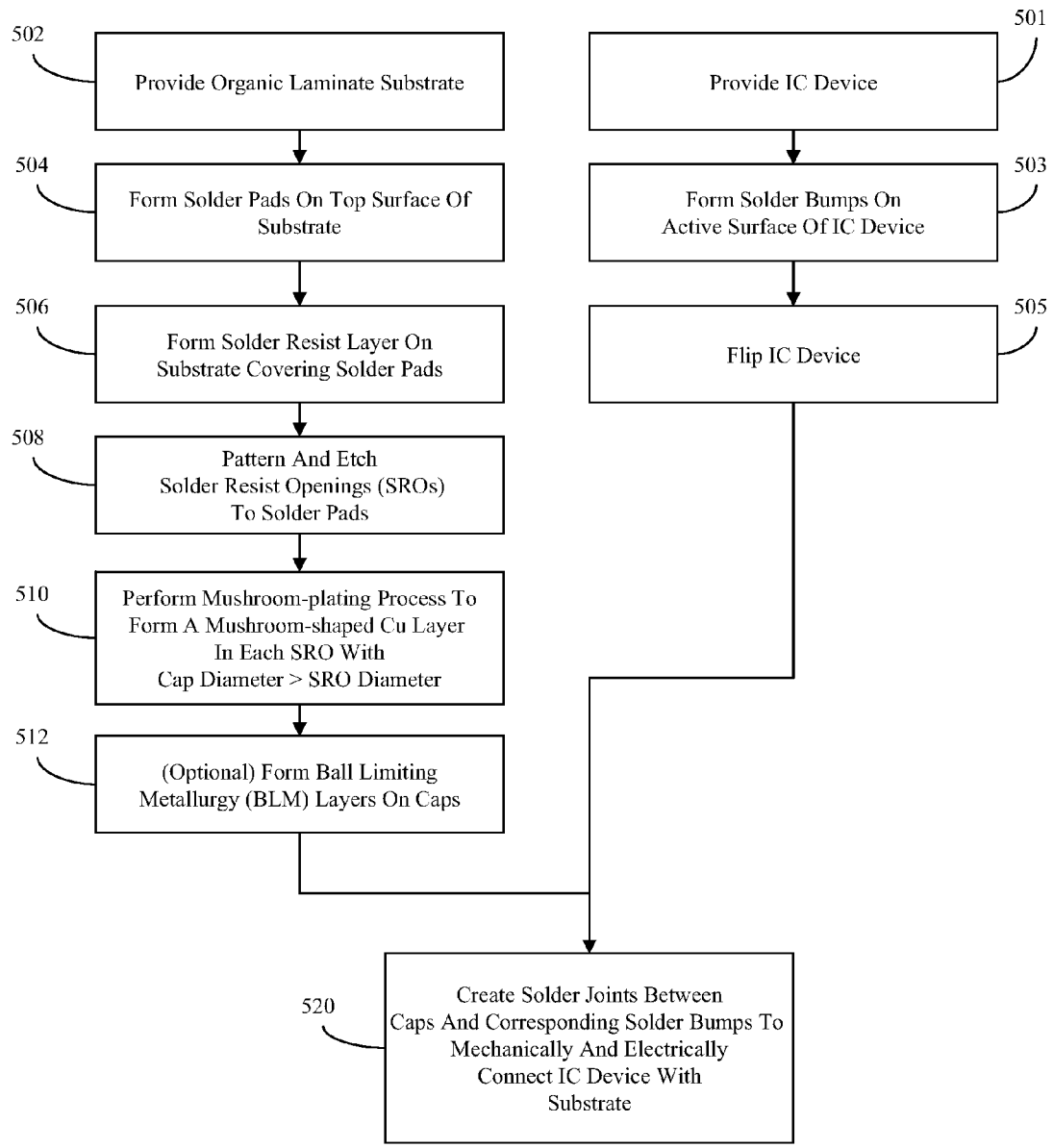
FIG. 5 is a flow diagram illustrating an embodiment of a method of forming the flip-chip assembly of FIG. 4.
Figure 6:
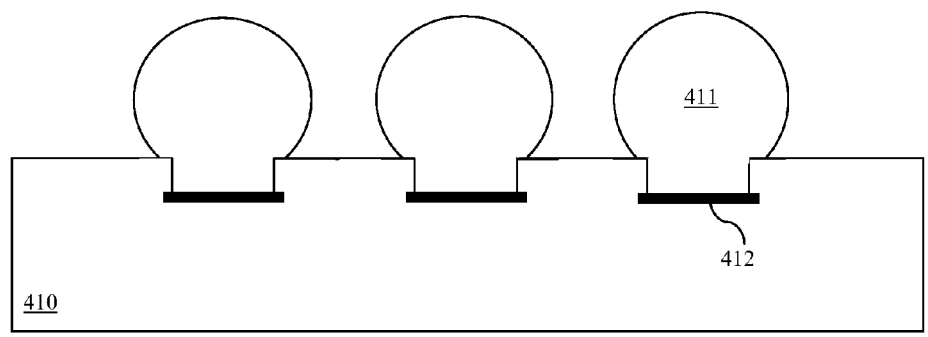
FIG. 6 is a schematic diagram illustrating a partially completed flip-chip assembly formed according to the method of FIG. 5.

Referring to the flow diagram of FIG. 5, also disclosed herein are embodiments of a method of forming the above-described electronic package 400. The method embodiments comprise providing an integrated circuit device 410 and using conventional processing techniques to form Pb-free solder bumps 441 on an array of conductive pads 412 (e.g., Cu or Al pads) on the active surface of the integrated circuit device 410. These Pb-free solder bumps 441 can, for example, be formed so that they comprise a Pb-free metal alloy of tin (Sn), Cu, silver (Ag) and/or other suitable metals (e.g., bismuth (Bi), indium (In), zinc (Zn), antimony (Sb), etc.) in varying amounts (501, see FIG. 6).

Figure 7:
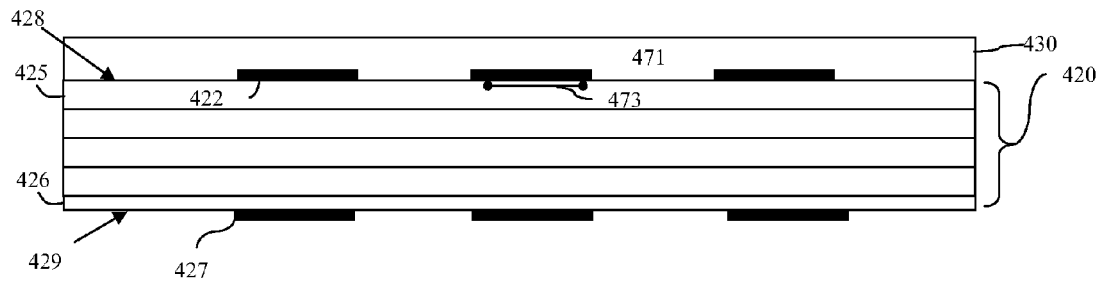
FIG. 7 is a schematic diagram illustrating a partially completed flip-chip assembly formed according to the method of FIG. 5.

Next, an organic laminate substrate 420 (e.g., a chip carrier) is provided (502, see FIG. 7). The organic laminate substrate 420 can comprise multiple layers of dielectric and conductive materials. The outermost layers 425 and 426 of the substrate 420 can comprise dielectric layers. Conductors 427 can also be positioned on the bottom surface 429 of the substrate 420 so as to allow connection of the flip-chip assembly, once formed, to a printed circuit board (PCB) (not shown).

An array of one or more solder pads 422 (i.e., substrate solder pads) can be formed on the top surface 428 of substrate 420 (504, see FIG. 7). For example, copper (Cu) pads or tin (Sn), silver (Ag) or gold (Au)-plated Cu pads can be formed on the top surface 428 of the substrate 420, using conventional processing techniques. These solder pads 422 can be coupled through the substrate layers to the conductors 427 on the bottom surface of the substrate 420.

A solder resist layer 430 can be formed on the substrate 420 such that it covers the substrate solder pad(s) 422 (506, see FIG. 7). The solder resist layer 430 can be formed using a solder resist material capable of preventing solder bridging, reducing solder pickup, protecting the substrate, preventing oxidation or corrosion, eliminating electromigration, etc. For example, the solder resist layer can be formed using a resin composition comprising an epoxy resin, an acrylic ester resin, and/or an epoxy acrylate.

Figure 8:
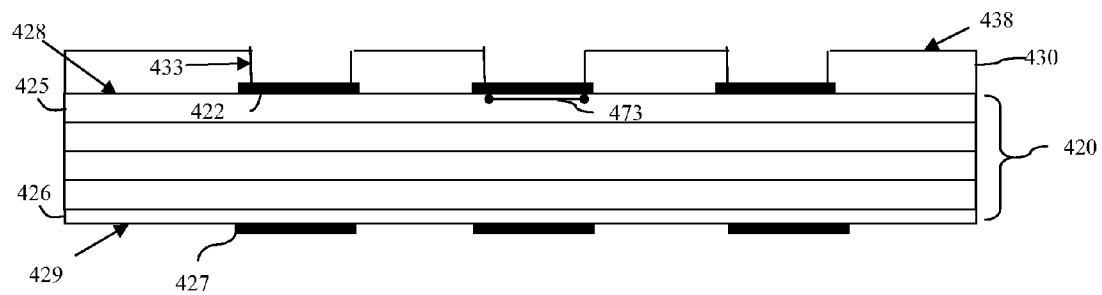
FIG. 8 is a schematic diagram illustrating a partially completed flip-chip assembly formed according to the method of FIG. 5.
Figure 9:
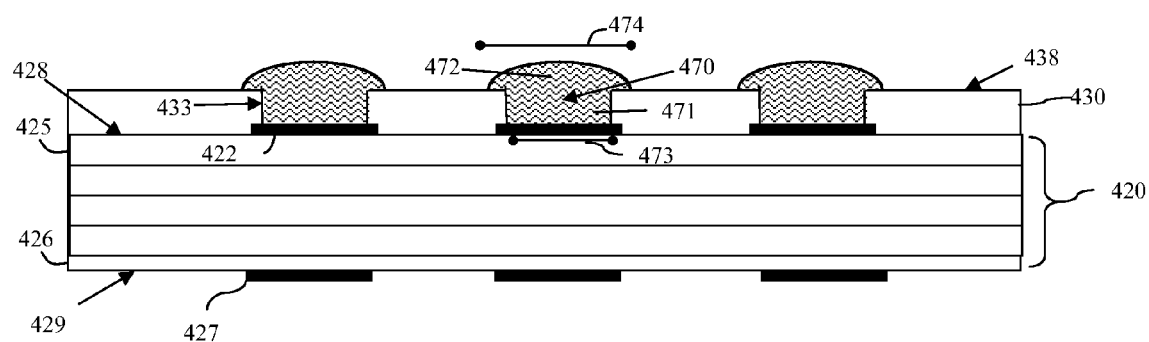
FIG. 9 is a schematic diagram illustrating a partially completed flip-chip assembly formed according to the method of FIG. 5.

Next, an array of one or more via(s) 433 (i.e., solder resist openings (SROs)) can be formed through the solder resist layer 430 (508, see FIG. 8). Specifically, conventional or other lithographic processing techniques can be used to pattern and etch vias 433 through the solder resist layer 430 such that each via 433 lands on a corresponding substrate solder pad 422 and has a predetermined diameter 473 (i.e., a first diameter or via diameter). Then, a mushroom-shaped metal layer 470 (e.g., a mushroom-shaped copper (Cu) layer) can be formed in each via 433 so that it fills the via 433 and further so that it overflows onto the top surface 438 of the solder resist layer 430 outside the via 433 (510, see FIG. 9). The process of forming this mushroom-shaped metal layer can comprise forming a lower portion 471 of the metal layer 470 adjacent the substrate solder pad 422 so as to fill the via 433. Thus, the lower portion 471 of the metal layer 470 will have the same diameter 473 as the via 433. Then, an upper portion 472 (i.e., a cap) of the metal layer 470 is formed above the lower portion 471 such that it extends laterally onto the top surface 438 of the solder resist layer 430 outside the via 433. Thus, the diameter 474 of the upper portion 472 of the metal layer 470 (i.e., the second diameter or cap diameter) is greater than the via diameter 473. Specifically, the cap 472 can be formed such that the cap diameter 474 ranges between approximately 1.05 and 10 times the via diameter 473. For example, the cap 472 can be formed such that the cap diameter 474 is at least 10 microns (μm) greater than the via diameter 473. In one exemplary embodiment, the via 433 can be formed with a diameter 473 of approximately 100 μm and the metal layer can be formed such that the cap diameter 474 is approximately 120 μm. To accomplish process 508, a conventional mushroom-plating technique can be used to electroplate the metal layer 470 onto the substrate solder pad 422 in this manner. Those skilled in the art will recognize that mushroom-plating is an extension of existing plating processes and can be used at the panel level.

Figure 10:
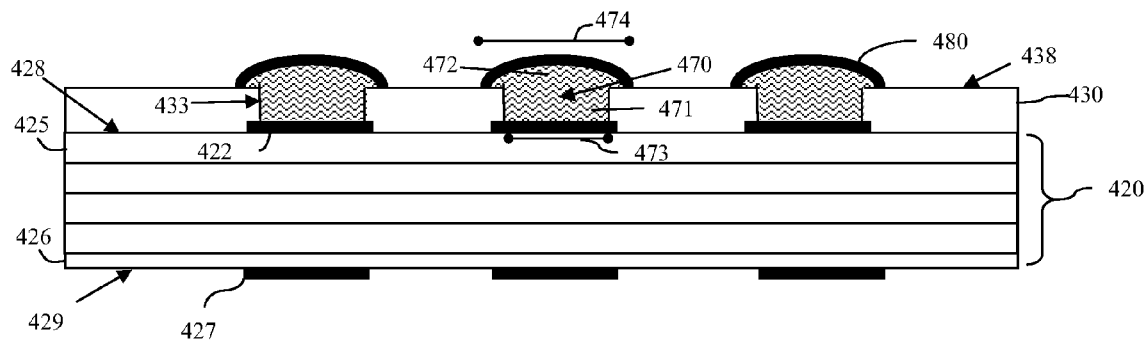
FIG. 10 is a schematic diagram illustrating a partially completed flip-chip assembly formed according to the method of FIG. 5.

Optionally, once the metal layer 470 is formed, one or more ball limiting metallurgy (BLM) layers 480 can be formed such that they cover all or a portion of the metal layer cap 472 (512, see FIG. 10). The BLM layers 480 can be formed, for example, using conventional processing techniques, such as electro-deposition. Specifically, the process of forming one or more BLM layers 480 can comprise forming an adhesion layer comprising a chromium (Cr) layer, a titanium (Ti) layer or any other suitable adhesion layer; forming a barrier layer comprising a nickel (Ni) layer, a palladium (Pd) layer, a platinum (Pt) layer or any other suitable layer for preventing electro-migration; and/or forming a bonding layer comprising a gold (Au) layer or any other suitable bonding layer.

Figure 11:
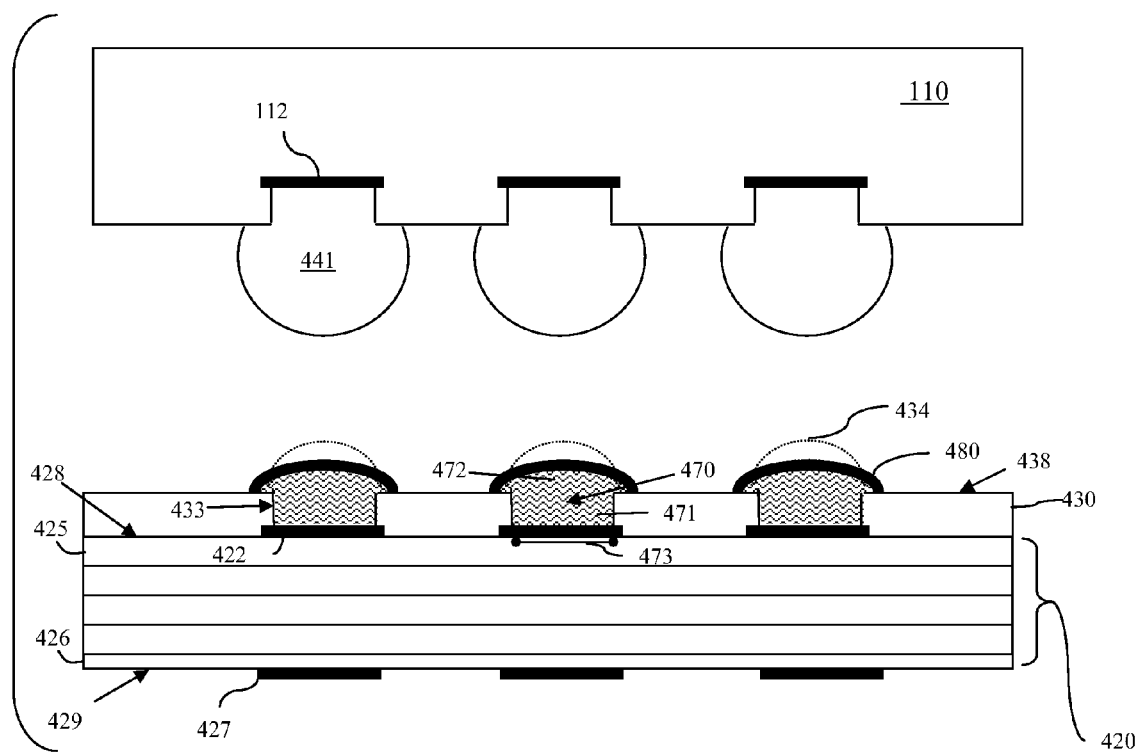
FIG. 11 is a schematic diagram illustrating a partially completed flip-chip assembly formed according to the method of FIG. 5.

Finally, solder joints 450 can be formed between the mushroom-shaped metal layer 470 at each via 433 and corresponding conductive pads 412 on the integrated circuit device 410 so as to electrically and mechanically connect the integrated circuit device 410 to the substrate 420 (520, see FIG. 4). Specifically, after the Pb-free solder bumps 441 are formed on the array of conductive pads 412 (e.g., Cu or Al pads) on the integrated circuit device 410 (at process 503, discussed above), the device 410 is flipped over (505, see FIG. 11). Optionally, solder paste 434 can be formed on top of the metal layer 470 above the optional BLM layers 480 and used to temporarily hold the solder ball or bump 441 of the integrated circuit device 410 in place. Specifically, the optional solder paste 434 can be formed on the metal layer 470 using well-known techniques (e.g., injection, screening, electro-deposition, etc.) such that the solder paste 434 is formed outside the solder resist opening 433 on top of the metal layer 470 above the optional BLM layer(s) 480. Because the solder paste 434 is not dispensed at the individual laminate level into a solder resist opening 433, but rather is dispensed at the panel level on top of the metal layer 470, the dispensing process is easier to control and monitor. It should be noted that, as discussed in detail above, the use of solder paste 434 is optional and can depend, for example, on whether or not the solder bumps 441 contain a sufficient amount of solder material to adequately mechanically and electrically connect the integrated circuit device 410 to the laminate substrate 420. If solder paste 434 is not used other techniques may be used to hold the integrated circuit device 410 in place during subsequent reflow.

Next, a reflow process is performed, during which the assembly is heated above the reflow temperature of the solder materials (i.e., above the reflow temperatures of the solder bump 441 and optional solder paste 434) and then cooled. During reflow, the optional solder paste 434 and solder bump 441 combine to form solder layer 440 positioned between and adhered to (i.e., mechanically and electrically connecting) the device conductive pads 412 and substrate solder pads 422, thereby creating the solder joint 450 (see FIG. 4). However, as discussed above, since either no solder paste 434 is used or, if it is used, it is not confined within the solder resist opening 433 (i.e., it is able to flatten out during reflow), the solder layer 440 is formed essentially void-free. Additionally, because the metal layer 470 facilitates a larger landing area for the joint, stress on the solder layer 440 is re-distributed and significantly lowered.

Therefore, disclosed above are embodiments of a flip-chip assembly and method of forming the assembly using lead (Pb)-free solder. This assembly incorporates mushroom-plated metal layers that fill and overflow solder resist openings on an organic laminate substrate (e.g., on a chip carrier). The lower portion of each mushroom plated-metal layer provides structural support to its corresponding solder resist opening. The upper portion of each mushroom-plated metal layer (i.e., the cap) provides a landing spot for a solder joint between an integrated circuit device (i.e., a semiconductor chip, die, etc.) and the substrate and, thereby, allows for enhanced solder volume control. The additional structural support to the solder resist openings, in combination with the enhanced solder volume control, minimizes the strain on the resulting solder joints and, particularly, minimizes the stress along the interface between the solder joints and the integrated circuit device. Additionally, the metal layer cap further allows the minimum diameter of the solder joint on the substrate-side of the assembly to be larger than the diameter of the solder resist opening. Thus, the invention decouples C4 (i.e., controlled collapsible chip connection) reliability concerns from laminate design concerns and, thereby, allows for greater design flexibility. For example, the solder volume can be increased without a corresponding increase in the size of the solder resist openings. Alternatively, solder volume can be maintained or even increased to improve solder reliability, while simultaneously decreasing the size and pitch of the solder resist openings. Another advantage of the present invention is that the mushroom-plated SRO would allow the use of organic solderability preservative (OSP) finishes on the solder pad, which otherwise have not been qualified for Pb-free solders. Finally, those skilled in the art will recognize that panel level processing, as opposed to individual laminate level processing, will likely result in a lower processing cost.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that these embodiments can be practiced with modification within the spirit and scope of the appended claims.

What is claimed is:

1. An electronic package comprising:
 a chip carrier comprising:
  a substrate;
  a first conductive pad on said substrate;
  a solder resist layer on said substrate covering said first conductive pad, said solder resist layer has a top surface;
  a via, having a first diameter, and extending through said solder resist layer to said first conductive pad;
  an electroplated metal layer having a lower portion and an upper portion,
   said lower portion being immediately adjacent to said first conductive pad and filling said via, and
   said upper portion being above said lower portion and having a second diameter greater than said first diameter such that said upper portion extends laterally over and physically contacts said top surface of said solder resist layer, said upper portion having a first side adjacent to said top surface and a second side opposite said first side, said second side being curved such that a thickness of said upper portion tapers from a center of said upper portion to an outer edge of said upper portion; and
  a plurality of ball limiting metallurgy layers covering said second side of said upper portion of said metal layer;
 a semiconductor chip comprising a second conductive pad; and
 a solder layer extending between said at least one ball limiting metallurgy layer and said second conductive pad so as to electrically connect said semiconductor chip to said chip carrier.

2. The electronic package according to claim 1, said second diameter ranging between approximately 1.05 and 10 times said first diameter.

3. The electronic package according to claim 1, said second diameter being at least 10 microns greater than said first diameter.

4. The electronic package according to claim 1, said solder layer comprising a lead-free solder that is essentially void-free and said electroplated metal layer comprising an electroplated copper layer.

5. The electronic package according to claim 1, said ball limiting metallurgy layers comprising at least: an adhesion layer; a barrier layer; and a bonding layer.

6. An electronic package comprising:
 a chip carrier comprising:
  an organic laminate substrate;
  a first conductive pad on said substrate;
  a solder resist layer on said substrate covering said first conductive pad, said solder resist layer has a top surface and comprising one of an epoxy resin, an acrylic ester resin and an epoxy acrylate resin;
  a via, having a first diameter, and extending through said solder resist layer to said first conductive pad;
  an essentially electroplated metal layer having a lower portion and an upper portion,
   said lower portion being immediately adjacent to said first conductive pad and filling said via, and
   said upper portion being above said lower portion and having a second diameter greater than said first diameter such that said upper portion extends laterally over and physically contacts said top surface of said solder resist layer, said upper portion having a first side adjacent to said top surface and a second side opposite said first side, said second side being curved such that a thickness of said upper portion tapers from a center of said upper portion to an outer edge of said upper portion; and
  a plurality of ball limiting metallurgy layers covering said second side of said upper portion of said metal layer;
 a semiconductor chip comprising a second conductive pad; and
 a solder layer extending between said ball limiting metallurgy layers and said second conductive pad so as to electrically connect said semiconductor chip to said chip carrier.

7. The electronic package according to claim 6, said second diameter ranging between approximately 1.05 and 10 times said first diameter.

8. The electronic package according to claim 6, said second diameter being at least 10 microns greater than said first diameter.

9. The electronic package according to claim 6, said solder layer comprising a lead-free solder that is essentially void-free and said electroplated metal layer comprising an electroplated copper layer.

10. The electronic package according to claim 6, said ball limiting metallurgy layers comprising at least: an adhesion layer; a barrier layer; and a bonding layer.

11. An electronic package comprising:
 a chip carrier comprising:
  an organic laminate substrate;
  a first conductive pad on said substrate;
  a solder resist layer on said substrate covering said first conductive pad, said solder resist layer has a top surface and comprising one of an epoxy resin, an acrylic ester resin and an epoxy acrylate resin;
  a via, having a first diameter, and extending through said solder resist layer to said first conductive pad;
  a copper layer having a lower portion and an upper portion,
   said lower portion being immediately adjacent to said first conductive pad and filling said via,
   said upper portion being above said lower portion and having a second diameter greater than said first diameter such that said upper portion extends laterally over and physically contacts said top surface of said solder resist layer, said upper portion having a first side adjacent to said top surface and second side opposite said first side, said second side being curved such that a thickness of said upper portion tapers from a center of said upper portion to an outer edge of said upper portion;
  a plurality of ball limiting metallurgy layers covering said second side of said upper portion of said copper layer; and
  solder paste on said plurality of ball limiting metallurgy layers;
 a semiconductor chip comprising a second conductive pad; and
 a solder layer extending between said solder paste and said second conductive pad so as to electrically connect said semiconductor chip to said chip carrier.

12. The electronic package according to claim 11, said second diameter ranging between approximately 1.05 and 10 times said first diameter.

13. The electronic package according to claim 11, said second diameter being at least 10 microns greater than said first diameter.

14. The electronic package according to claim 11, said solder layer comprising a lead-free solder that is essentially void-free and said copper layer comprising an electroplated copper layer.

15. The electronic package according to claim 11, said ball limiting metallurgy layers comprising an adhesion layer, a barrier layer, and a bonding layer.

* * * * *